United States Patent
Lee et al.

(10) Patent No.: US 6,329,863 B1
(45) Date of Patent: Dec. 11, 2001

(54) INPUT CIRCUIT HAVING A FUSE THEREIN AND SEMICONDUCTOR DEVICE HAVING THE SAME

(75) Inventors: Seung-hoon Lee, Yongin; Tae-seong Jang, Suwon, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/477,235

(22) Filed: Jan. 4, 2000

(51) Int. Cl.[7] ....................................... H03K 5/08
(52) U.S. Cl. ...................... 327/309; 327/525; 327/565
(58) Field of Search ................................ 327/309, 525, 327/564, 565, 566; 365/225.7

(56) References Cited

U.S. PATENT DOCUMENTS

| | | | |
|---|---|---|---|
| 4,296,456 | 10/1981 | Reid | 361/403 |
| 5,731,945 | * 3/1998 | Bertin et al. | 361/111 |
| 5,807,791 | * 9/1998 | Bertin et al. | 438/738 |
| 6,141,245 | * 10/2000 | Bertin et al. | 365/185.05 |

* cited by examiner

*Primary Examiner*—Jeffrey Zweizig
(74) *Attorney, Agent, or Firm*—Mills&Onello LLP

(57) ABSTRACT

A semiconductor device having an input circuit well-suited for use in a stacked-chip configuration, results in a reduction in input capacitance, and an overall improvement in transmission speed. The semiconductor device includes at least two bonding pads which receive external electrical input signals from a shared common external pin, and at least two internal circuits, each electrically coupled to a corresponding bonding pad by a signal transmission line. The semiconductor device further includes at least two protective elements, each electrically coupled to a corresponding signal transmission line, each for protecting the internal circuits from excessive electrical transmission characteristics in the input signal. At least two fuses are electrically coupled in series between the corresponding protective element and signal transmission line. The fuses are each capable of being opened to electrically insulate the protective elements from the bonding pads and the internal circuits. By keeping only one fuse active, and opening the rest, the overall system capacitance, as viewed by the common external pin, is greatly reduced.

8 Claims, 3 Drawing Sheets

INPUT CIRCUIT HAVING A FUSE THEREIN AND SEMICONDUCTOR DEVICE HAVING THE SAME

BACKGROUND OF THE INVENTION

1. Field of the Invention

The present invention relates to a semiconductor device, and more particularly, to an input circuit for a semiconductor device having a fuse for selective activation/deactivation of circuits, for example protective circuits, therein, and a semiconductor device incorporating such an input circuit.

2. Description of the Related Art

Throughout the evolution of semiconductor devices, the level of integration has steadily and dramatically increased to the point where presently, 64 Megabyte (Mb) Dynamic Random Access Memories (DRAMs) are routinely fabricated. In general, as integration increases, so too does device complexity, and therefore, despite advancements in integration, device size can increase. As a consequence, this demand for larger device sizes, coupled with the demand for heightened integration, is often accompanied by the need for development of new technology in related fields, such as photolithography, which carries with it high cost and reduced device yield.

To address this issue, "stack-type" packages have recently been proposed, suitable for improving the integration of a semiconductor device by more than two fold. Here, the stack-type package refers to both a chip-stack package in which at least two integrated circuit chips are stacked within a single package, and a package-stack package in which at least two packages, each having a chip incorporated therein, are stacked. In this manner, the effective device capability is doubled, while maintaining the same footprint.

For example, in a chip-stack package, two 128 Mb memory chips may be mounted within a single package to provide a 256 Mb memory chip. Alternatively, in a package-stack package, two individually-packaged 128 Mb chip packages may be stacked, thereby likewise providing a 256 Mb memory chip. In this manner, with either form of stack-type package, the integration level can be doubled using conventional processing technology, without the need for advancement of the technology.

As a result of the stack-type package configuration, each external package pin is shared by circuits residing on two separate memory chips. Consequently, the input capacitance value as seen by the external pin increases. In the case of two stacked packages, for example, corresponding external pins are electrically connected to each other so that the load applied to the input circuit connected to the respective external pins is double that of the single individual packages. This results in a reduction in transmission speed for signals traversing the external pin.

SUMMARY OF THE INVENTION

To address the above limitations, it is an object of the present invention to provide an input circuit connected to an external pin adapted to minimize the input capacitance value as viewed by the pin.

It is another object of the present invention to provide a semiconductor device employing such an input circuit.

Accordingly, to achieve the above object, there is provided an input circuit for a semiconductor device including at least one bonding pad which externally receives an electrical input signal and an internal circuit connected to the bonding pad by a signal transmission line. The input circuit includes at least one protective element, electrically coupled to the signal transmission line, for protecting the internal circuit from excessive transmission characteristics (i.e. voltage, current, power, etc) in the input signal. A fuse is electrically coupled in series between the protective element and the signal transmission line, the fuse capable of being opened to electrically isolate the protective element from the bonding pad and the internal circuit.

The protective element preferably comprises a clamping circuit for clamping a voltage level of the input signal to within a predetermined operation voltage range.

To achieve the second object, the semiconductor device includes at least two bonding pads which receive external electrical input signals from a shared common external pin, and at least two internal circuits, each electrically coupled to a corresponding bonding pad by a signal transmission line. The semiconductor device further includes at least two protective elements, each electrically coupled to a corresponding signal transmission line, each for protecting the internal circuits from excessive electrical transmission characteristics in the input signal. At least two fuses are electrically coupled in series between the corresponding protective element and signal transmission line. The fuses are each capable of being opened to electrically insulate the protective elements from the bonding pads and the internal circuits.

The fuses are preferably formed of conductive layers which can be electrically cut or opened. The semiconductor device may be a chip-stack package in which at least two chips are stacked in a single package, or a package-stack package in which at least two packages, each having a chip incorporated therein, are stacked and pins corresponding to each package are externally connected.

By retaining only a single active fuse, and opening the balance of fuses from the other internal circuits, the overall system capacitance, as viewed by the common external pin, is greatly reduced. Therefore, signal transmission speed is greatly improved.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
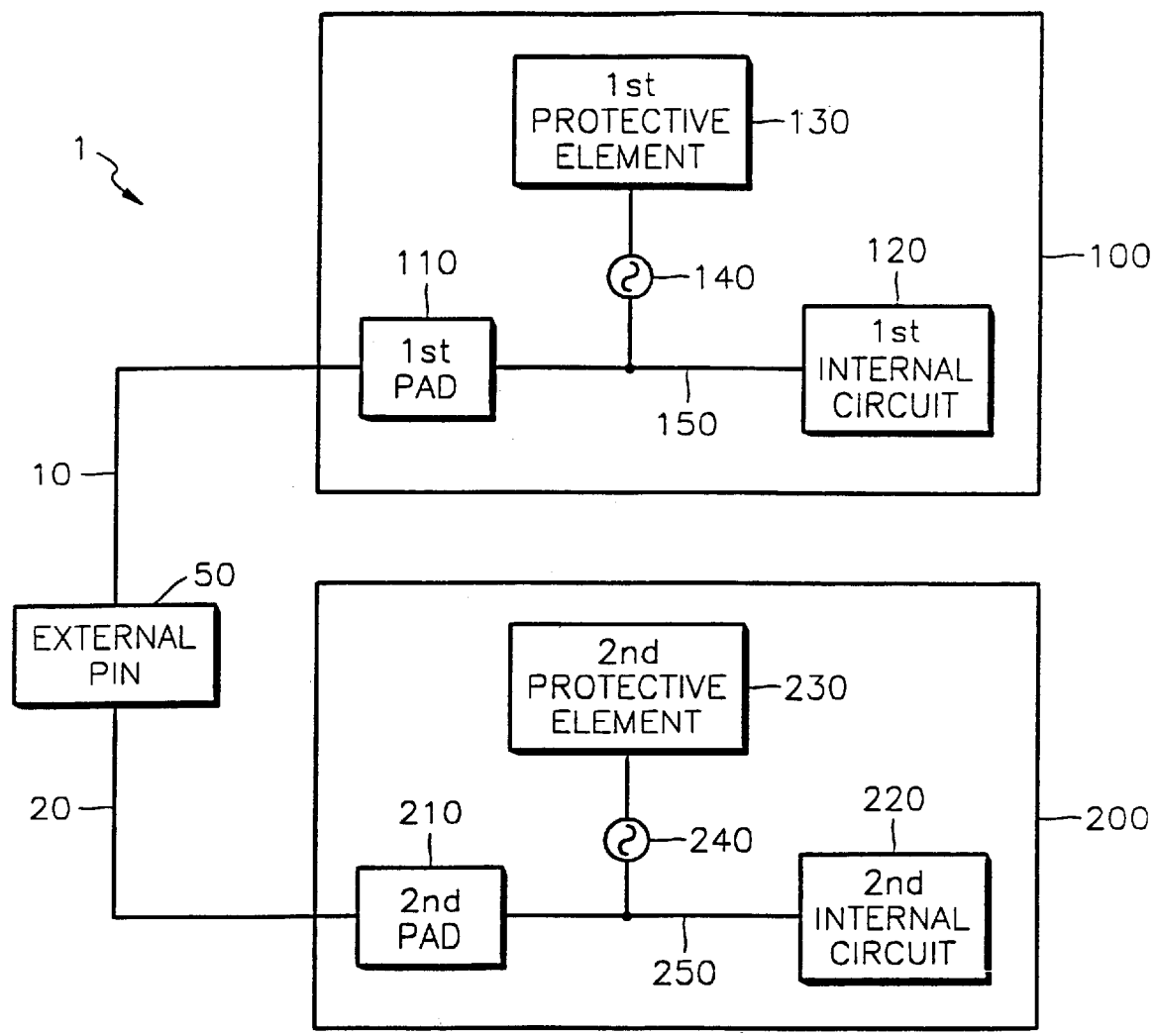
FIG. 1 is a block diagram of a semiconductor device having an input circuit according to an embodiment of the present invention.

FIG. 1 is a block diagram of a semiconductor device having an input circuit according to an embodiment of the present invention. For the convenience of explanation, a chip-stack type semiconductor device in which, for example, two semiconductor chips are stacked and jointly packaged, will be described in this embodiment.

Referring to FIG. 1, a semiconductor device 1 of the present invention includes at least one external pin 50, first and second input circuits 100 and 200 which receive electrical signals through the external pin 50, and first and second bonding wires 10 and 20 for electrically connecting the external pin 50 to the first and second input circuits 100 and 200.

Each of the first and second input circuits 100 and 200 is formed on a separate semiconductor chip and shares the external pin 50. Preferably, the first and second input circuits 100 and 200 have similar, or identical, configurations.

The first input circuit 100 includes a first bonding pad 110, a first internal circuit 120, a first protective element 130, a first fuse 140 and a first signal transmission line 150.

The first pad 110 receives an electrical signal to be input to the first internal circuit 120 and is electrically connected to the external pin 50 through the first bonding wire 10. The first pad 110 is connected to the first input circuit 120 through the first signal transmission line 150. The electrical signal received by the first pad 10 through the external pin 50 is input to the first input circuit 120.

The first protective element 130 protects the first internal circuit 120 from electrical signals exceeding a range of predetermined transmission characteristics (e.g., voltage, current, etc. . . . ), input through the external pin 50. The first protective element 130 is connected to the first signal transmission line 150. Preferably, the protective element 130 comprises a clamping circuit for clamping a signal input from the first pad 110 to ensure that the signal transmission characteristic does not deviate from a predetermined value, for example, a range of operation voltages. The first internal circuit 120 may comprise, for example, an input buffer for buffering the input signal.

The first fuse 140 is preferably connected in series between the first protective element 130 and the first signal transmission line 150. In other words, one node of the first fuse 140 is connected to the first protective element 130 and the other node thereof is connected to the first signal transmission line 150.

Preferably, the first fuse 140 is formed of a conductive layer which can be severed, or otherwise made to be electrically insulated or isolated. The first protective element 130 can be electrically isolated from the first signal transmission line 150 by cutting the first fuse 140 so that it is electrically isolated from the first pad 110 and the first internal circuit 120.

Like the first input circuit 100, the second input circuit 200 includes a second bonding pad 210, a second internal circuit 220, a second protective element 230, a second fuse 240 and a second signal transmission line 250, each of which has the same configuration of the corresponding element of the first input circuit 100. An explanation of the configuration and operation thereof will therefore be omitted.

In the semiconductor device 1 of the present invention, either the first fuse 140 or the second fuse 240 provided in the first and second input circuits 100 and 200, respectively, is selectively opened or cut in a manner well known in the art of semiconductor technology for opening semiconductor fuses.

For example, when the first fuse 140 is cut, the second fuse 240 is not cut. Thus, the first protective element 130 is electrically isolated from the first signal transmission line 150, and the second protective element 230 is electrically connected to the second signal transmission line 250. That is, the first protective element 130 does not operate, and only the second protective element 230 operates.

In this configuration, since the first and second signal transmission lines 150 and 250 are electrically connected through the external pin 50, the second protective element 230 stands in for the inactivated first protective element 130 and serves to protect the first internal circuit 120 and second internal circuit 220 from excessive electrical signals input from the external pin 50.

Conversely, when the second fuse 240 is cut, the first fuse 140 is not cut, the second protective element 230 does not operate, and only the first protective element 130 operates. In this case, the first protective element 130 operates in lieu of the second protective element 230.

As described above, according to the semiconductor device 1 of the present invention, only one of the protective elements 130 and 230 provided in the internal circuits 100, 200, respectively, is selectively connected to the external pin 50. The selected protective element serves as a protective element for both input circuits 100, 200. As a result, the input capacitance as viewed by the external pin 50 is reduced by an amount corresponding to the capacitance of a non-selected protective element, which will now be described in more detail.

For example, the input capacitance as viewed by the external pin 50 corresponds to the collective capacitance of the first and second bonding wires 10 and 20, the first and second internal circuits 120 and 220, the first and second protective elements 130 and 230, and the first and second signal transmission lines 150 and 250. According to the above-described conventional stack-type package, since two input circuits 100 and 200 are connected to the external pin 50, the input capacitance is twice that of the conventional single semiconductor device.

According to the present invention, in a stack-type semiconductor device including a plurality of input circuits, since only one out of the plurality of protective elements is selected, the remainder being electrically isolated, the input capacitance of the overall stack as viewed by the external pin 50 is reduced. In particular, in order to protect the internal circuits from excessive electrical signals, the protective elements 130 and 230 are formed such that they have a considerably large size as compared to other transistors constituting the corresponding internal circuit. As a result, the beneficial reduction in input capacitance is relatively large.

Therefore, according to the present invention, the input capacitance of the stack-type package as viewed by the external pin is less than that of the conventional stack-type package, and, as a result, signal transmission speed is thus improved.

Figure 2:
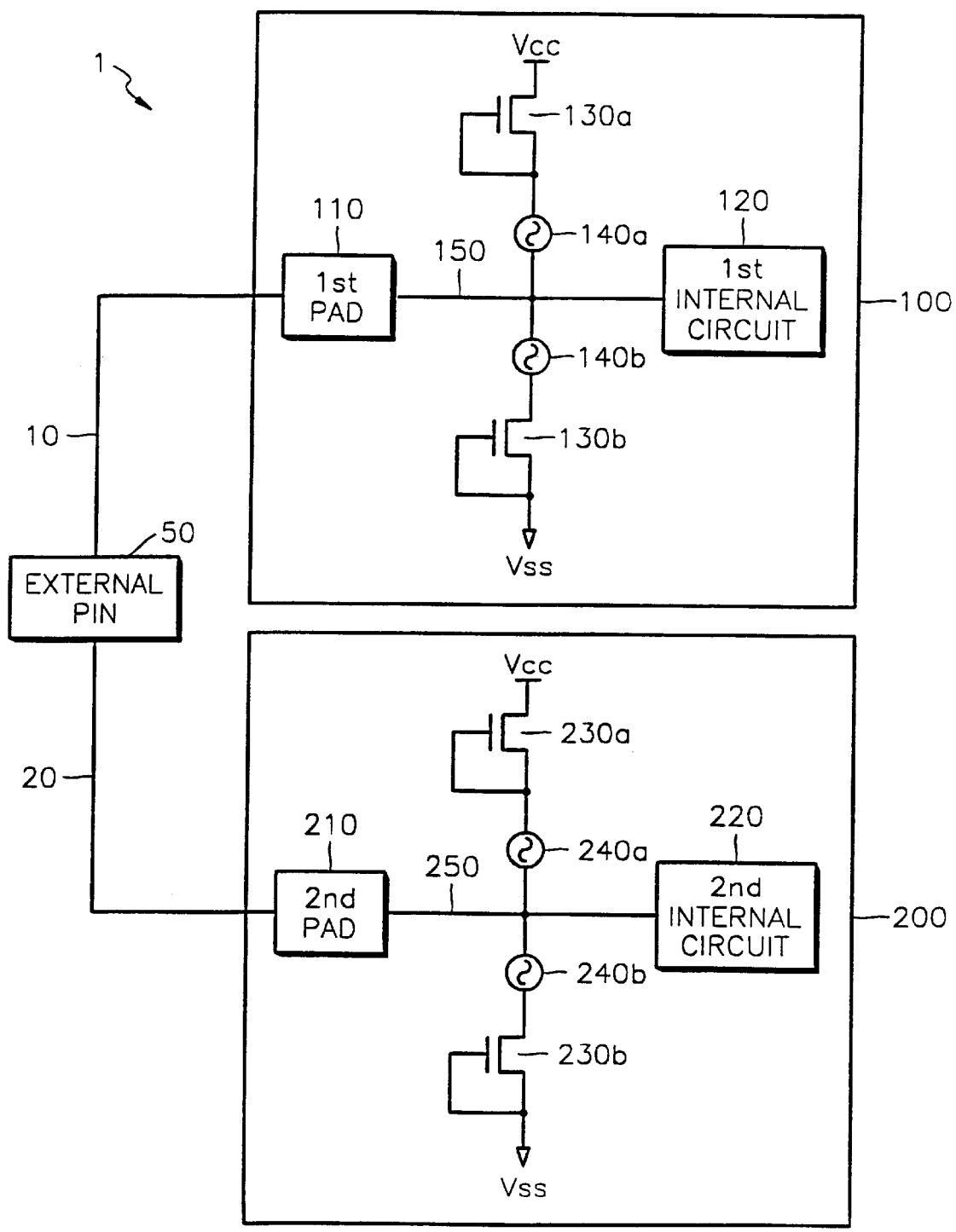
FIG. 2 is a block diagram of a semiconductor device in which each of the first and second protective elements shown in FIG. 1 are realized as clamp circuits.

FIG. 2 is a block diagram of a semiconductor device having input circuits 100, 200 according to a preferred embodiment of the present invention, in which the first and second protective elements 130 and 230 shown in FIG. 1 comprise clamping circuits.

In FIG. 2, the same elements are represented by the same reference numerals as those shown in FIG. 1. FIG. 2 shows the same configuration as that of FIG. 1, with the exception that the first and second protective elements 130 and 230 of FIG. 1 are comprised of upper clamping circuits 130a and 230a and lower clamping circuits 130b and 230b, and the first and second fuses 140 and 240 of FIG. 1 are comprised of upper fuses 140a and 240a and lower fuses 140b and 240b.

Referring to FIG. 2, the first protective element (130 of FIG. 1), according to a preferred embodiment of the present invention, includes the upper clamping circuit 130a for discharging an input voltage (i.e., the voltage received from the external pin 50) exceeding the level of an internal power voltage Vcc, and the lower clamping circuit 130*b* for discharging an input voltage of less than a ground voltage Vss. The first fuse 140 includes the upper fuse 140*a* and the lower fuse 140*b* for electrically isolating the upper clamping circuit 130*a* and the lower clamping circuit 130*b* from the first signal transmission line 150.

Likewise, the second protective element (230 of FIG. 1) includes the upper clamping circuit 230*a* and the lower clamping circuit 230*b*. The second fuse 240 includes the upper fuse 240*a* and the lower fuse 240*b*.

According to the semiconductor device 1 of the present invention, the upper fuses 140*a* and 240*a* and the lower fuses 140*b* and 240*b* provided in the internal circuits 100 and 200, respectively, are selectively opened, or cut.

For example, when the upper fuse 140*a* and the lower fuse 140*b* provided in the internal circuit 100 are cut, the upper clamping circuit 130*a* and the lower clamping circuit 130*b* do not operate and the upper clamping circuit 230*a* and the lower clamping circuit 230*b* operate.

Therefore, an input voltage to the external pin 50 which is beyond the operation voltage range of Vss to Vcc, is discharged by the upper clamping circuit 230*a* and the lower clamping circuit 230*b* provided in the second input circuit 200. Thus, only a voltage level within the operation voltage range can be input to the first and second internal circuits 120 and 220.

As a result, since only the upper clamping circuit 130*a* or 230*a* and the lower clamping circuit 130*b* or 230*b* provided in either input circuit 100 or 200 selectively operate, the input capacitance as viewed by the external pin 50 is reduced, as described above.

The present invention is applicable to both package-stack semiconductor devices as well as chip-stack semiconductor devices, as well as similar devices having input circuits connected to a common external pin.

Figure 3:
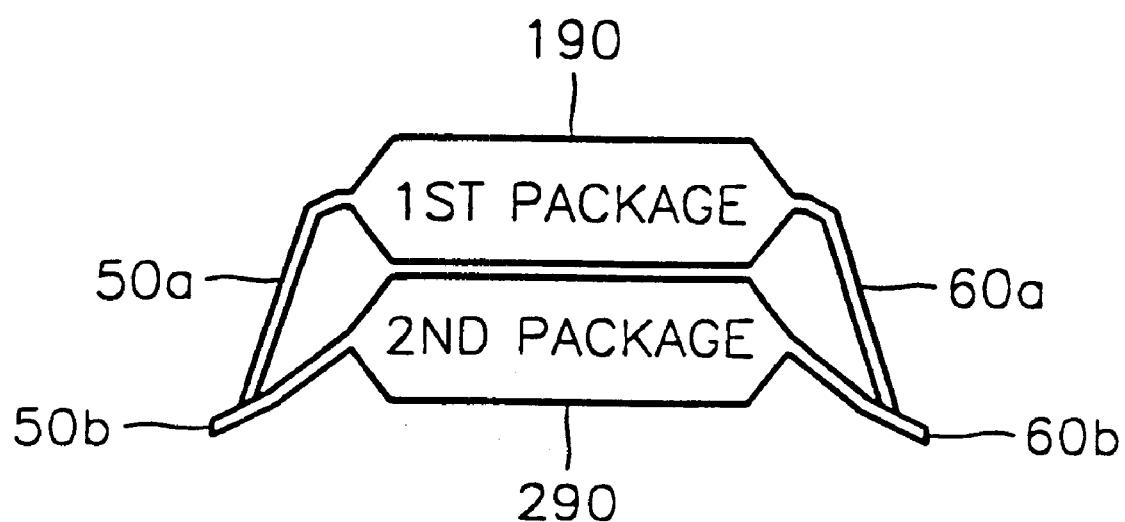
FIG. 3 is a side view of a package-stack type semiconductor device according to another embodiment of the present invention.

FIG. 3 is a side view of a package-stack type semiconductor device according to another embodiment of the present invention.

Referring to FIG. 3, in the package-stack type semiconductor device according to the present invention, at least two packages, for example, first and second packages 190 and 290, are stacked. The first package 190 includes a plurality of external pins 50*a* and 60*a*, and the second package 290 includes a plurality of external pins 50*b* and 60*b*. As shown in FIG. 3, the external pins 50*a* and 50*b* and the external pins 60*a* and 60*b* are externally connected to each other.

Although not shown, first and second semiconductor chips are mounted within the first and second packages 190 and 290, respectively. The first and second semiconductor chips may have the same pin configuration, for example. Like input circuits, for example, the first and second input circuits 100 and 200 shown in FIGS. 1 and 2, are formed in the firs and second semiconductor chips.

According to this embodiment, the first and second semiconductor chips incorporating the first and second input circuits 100 and 200, respectively, are mounted in the first and second packages 190 and 290, and the first and second packages 190 and 290 have corresponding electrically-connected external pins mounted thereon. The configuration and operation of the respective input circuits 100 and 200 can be described with reference to FIGS. 1 and 2. Therefore, according to this embodiment, the same effect as in the first embodiment can be attained.

As described above, according to the present invention, a semiconductor device in a stacked type configuration has selected redundant protection devices deactivated and isolated from the common external pins. In this manner, input capacitance as viewed by an external pin is minimized, while the activated protection device continues to serve as a protective element for all input circuits in the stack. Accordingly, the signal transmission speed of the semiconductor device is improved.

While this invention has been particularly shown and described with references to preferred embodiments thereof, it will be understood by those skilled in the art that various changes in form and detail may be made herein without departing from the spirit and scope of the invention as defined by the appended claims.

For example, a chip-stack type semiconductor device on which two semiconductor chips are stacked, and a package-stack type semiconductor device in which two packages are stacked, have been described in the embodiments of the present invention. The present invention is equally applicable to a chip-stack type semiconductor device in which three or more semiconductor chips are stacked, and a package-stack type semiconductor device in which three or more packages are stacked.

What is claimed is:

1. A semiconductor memory device having a first semiconductor chip and a second semiconductor chip arranged in a stack,
    the first semiconductor chip comprising:
        a first pad electrically connected to an external pin;
        a first internal circuit;
        a first transmission line electrically connected between the first pad and the first internal circuit;
        a first protective element, connected between a first power supply voltage and a first node, for protecting the first internal circuit from excessive electrical signals input to the first pad;
        a first fuse connected between the first node and the first transmission line;
        a second protective element, connected between a ground voltage and a second node, for protecting the first internal circuit form excessive electrical signals input to the first pad; and
        a second fuse connected between the second node and the first transmission line,
    and the second semiconductor chip comprising:
        a second pad electrically connected to the external pin;
        a second internal circuit;
        a second transmission line electrically connected between the second pad and the second internal circuit;
        a third protective element, connected between the first power supply voltage and a third node, for protecting the second internal circuit from excessive electrical signals input to the second pad;
        a third fuse connected between the third node and the second transmission line;
        a fourth protective element, connected between the ground voltage and a fourth node, for protecting the second internal circuit from excessive electrical signals input to the second pad; and
        a fourth fuse connected between the fourth node and the second transmission line.

2. A semiconductor memory device according to claim 1, wherein each of the protective elements comprise a clamping circuit.

3. A semiconductor memory device according to claim 2, wherein the clamping circuit comprises a diode.

4. A semiconductor memory device according to claim 2, wherein the clamping circuit comprises a gate coupled source transistor.

5. A semiconductor memory device comprising a first package having a first semiconductor chip packaged therein and a second package having a second semiconductor chip packaged therein, the first and second packages arranged in a stack in the semiconductor memory device, the first semiconductor chip comprising:
- a first pad electrically connected to an external pin;
- a first internal circuit;
- a first transmission line electrically connected between the first pad and the first internal circuit;
- a first protective element, connected between a first power supply voltage and a first node, for protecting the first internal circuit from excessive electrical signals input to the first pad;
- a first fuse connected between the first node and the first transmission line;
- a second protective element, connected between a ground voltage and a second node, for protecting the first internal circuit from excessive electrical signals input to the first pad; and
- a second fuse connected between the second node and the first transmission line, and the second semiconductor chip comprising:
- a second pad electrically connected to the external pin;
- a second internal circuit;
- a second transmission line electrically connected between the second pad and second internal circuit;
- a third protective element, connected between the first power supply voltage and a third node, for protecting the second internal circuit from excessive electrical signals input to the second pad;
- a third fuse connected between the third node and the second transmission line;
- a fourth protective element, connected between the ground and a fourth node, for protecting the second internal circuit from excessive electrical signals input to the second pad; and
- a fourth fuse connected between the fourth node and the second transmission line.

6. A semiconductor memory device according to claim 5, wherein the protective elements each comprise a clamping circuit.

7. A semiconductor memory device according to claim 6, wherein the clamping circuit comprises a diode.

8. A semiconductor memory device according to claim 6, wherein the clamping circuit comprises a gate coupled source transistor.

* * * * *